United States Patent
Arrighi

(10) Patent No.: US 9,721,045 B2
(45) Date of Patent: Aug. 1, 2017

(54) OPERATION IN AN IMMERSIVE VIRTUAL ENVIRONMENT

(71) Applicant: Dassault Systemes, Velizy Villacoublay (FR)

(72) Inventor: Pierre-Antoine Arrighi, Paris (FR)

(73) Assignee: Dassault Systemes, Velizy Villacoublay (FR)

(*) Notice: Subject to any disclaimer, the term of this patent is extended or adjusted under 35 U.S.C. 154(b) by 925 days.

(21) Appl. No.: 13/944,716

(22) Filed: Jul. 17, 2013

(65) Prior Publication Data

US 2014/0032181 A1    Jan. 30, 2014

(30) Foreign Application Priority Data

Jul. 24, 2012   (EP) .................................. 12305902

(51) Int. Cl.
*G06F 17/50* (2006.01)
*G06F 3/0481* (2013.01)

(52) U.S. Cl.
CPC .......... *G06F 17/50* (2013.01); *G06F 3/04815* (2013.01)

(58) Field of Classification Search
CPC .............................. G06F 17/50; G06F 3/04815
USPC .............................................................. 703/1
See application file for complete search history.

(56) References Cited

U.S. PATENT DOCUMENTS

| | | | | |
|---|---|---|---|---|
| 6,842,175 B1 | 1/2005 | Schmalstieg et al. | | |
| 7,634,354 B2* | 12/2009 | Salmre | ................... | G01C 21/20 340/995.1 |
| 7,814,436 B2* | 10/2010 | Schrag | ................ | G06F 3/04815 715/836 |
| 8,314,789 B2* | 11/2012 | Fitzmaurice | ........ | G06F 3/04815 345/157 |
| 8,643,569 B2* | 2/2014 | Vesely | .................... | G06F 3/011 345/156 |
| 8,725,466 B2* | 5/2014 | Santina | ............... | G06F 17/5004 703/1 |
| 8,910,058 B2* | 12/2014 | Dawson | ................. | G06Q 10/10 715/757 |
| 9,067,097 B2* | 6/2015 | Lane | .................. | A63B 24/0087 |
| 2002/0123812 A1* | 9/2002 | Jayaram | .................. | G06T 19/20 700/98 |

(Continued)

OTHER PUBLICATIONS

Bowman et al. ("An Evaluation of Techniques for Grabbing and Manipulating Remote Objects in Immersive Virtual Environments", ACM, 1997).*

(Continued)

*Primary Examiner* — Omar Fernandez Rivas
*Assistant Examiner* — Iftekhar Khan
(74) *Attorney, Agent, or Firm* — Hamilton, Brooke, Smith & Reynolds, P.C.

(57) ABSTRACT

It is provided a computer-implemented method of three-dimensional design in an immersive virtual environment. The method comprises the steps of determining a position of an instantiation of a physical designer in the virtual environment; instantiating an object via an interaction of the instantiation of the physical designer with a stocking zone attached to its position, the interaction being controlled by a body configuration of the physical designer; and performing a design operation with the object. Such a method improves the design of an object.

9 Claims, 6 Drawing Sheets

(56) References Cited

U.S. PATENT DOCUMENTS

| | | | |
|---|---|---|---|
| 2003/0058238 A1* | 3/2003 | Doak | G06T 19/00 345/419 |
| 2009/0051681 A1* | 2/2009 | Sharp | A63F 13/10 345/419 |
| 2009/0164919 A1* | 6/2009 | Bates | G06Q 10/10 715/757 |
| 2010/0198653 A1* | 8/2010 | Bromenshenkel | G06Q 30/06 705/7.11 |
| 2011/0054870 A1* | 3/2011 | Dariush | G06F 3/011 703/11 |
| 2012/0264510 A1* | 10/2012 | Wigdor | A63F 13/213 463/31 |
| 2012/0320034 A1* | 12/2012 | Baron | G06F 17/50 345/419 |
| 2013/0154913 A1* | 6/2013 | Genc | G06F 3/012 345/156 |

OTHER PUBLICATIONS

Elmqvist et al. ("Evaluating Motion Constraints for 3D Wayfinding in Immersive and Desktop Virtual Environments", ACM, 2008, pp. 1769-1778).*

Chu et al. ("Multi-sensory user interface for a virtual-reality-based computer-aided design system", Elsevier, 1997, pp. 709-725).*

Mine et al. hereafter Mine ("Moving Objects in Space: Exploiting Proprioception In Virtual-Environment Interaction", Association for Computing Machinery, 1997, pp. 1-8).*

Szalavari et al. ("The Personal Interaction Panel—a Two-Handed Interface for Augmented Reality",Eurographics '97, pp. 1-12).*

Kruger et al. ("The Responsive Workbench: A Virtual Work Environment", IEEE, 1995, pp. 42-47).*

Butterworth, Jeff et al., "3DM: A Three Dimensional Modeler Using a Head-Mounted Display" *Proceedings of the Symposium on Interactive 3D Graphics*, New York, USA, pp. 135-138 (Mar. 29, 1992).

European Search Report dated Dec. 7, 2012 from counterpart European Application No. EP 12305902.

European Search Report dated Jan. 29, 2013 from related European Application No. EP 12305903.

Kehl, Roland et al., "Real-Time Pointing Gesture Recognition for an Immerseive Environment" *Proceedings of the Sixth IEEE International Conference on Automatic Face and Gesture Recognition*, Piscataway, NJ, USA, pp. 577-582 (May 17, 2004).

Mine, Mark R. et al., "Moving Objects in Space: Exploiting Proprioception In Virtual Environment Interaction" *Computer Graphics Proceedings*, USA, pp. 19-26 (Aug. 3, 1997).

Nishino, Hioaki et al., "A Virtual Environment for Modeling 3D Objects Through Spatial Interaction", *Systems, Man, and Cybernetics, IEEE SMC '99 International Conference Proceedings on Tokyo, Japan*, Piscataway, NJ, USA, 6:81-86 (Oct. 12-15, 1999).

Osawa, Noritaka et al., "An Immersive Programming System: Ougi", ICAT 2002 (Dec. 4, 2002).

* cited by examiner

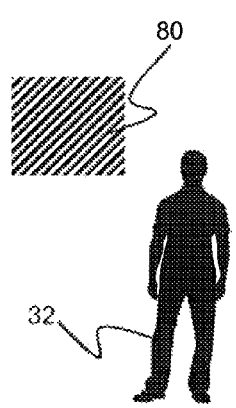 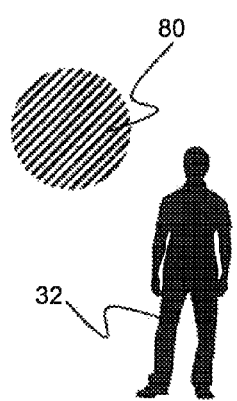 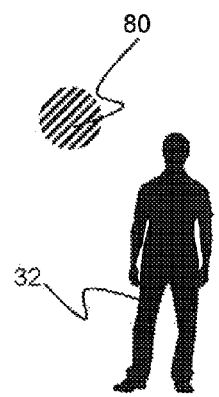
FIG. 8  FIG. 9  FIG. 10
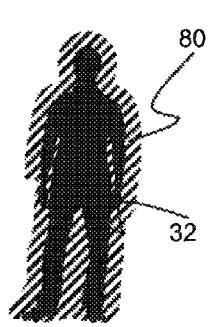 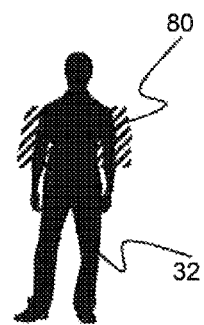
FIG. 11  FIG. 12
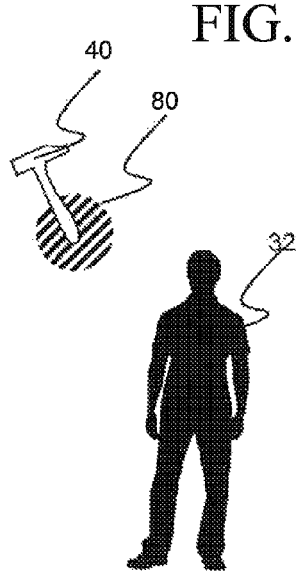 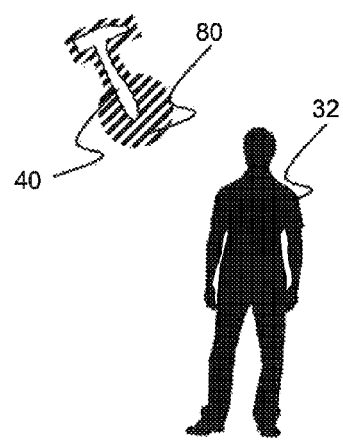
FIG. 13  FIG. 14

OPERATION IN AN IMMERSIVE VIRTUAL ENVIRONMENT

RELATED APPLICATION(S)

This application claims priority under 35 U.S.C. §119 or 365 to European Patent Application No. 12305902.4, filed Jul. 24, 2012. The entire teachings of the above application(s) are incorporated herein by reference.

FIELD OF THE INVENTION

The invention relates to the field of computer programs and systems, and more specifically to a method, system and program for three-dimensional design in an immersive virtual environment.

BACKGROUND OF THE INVENTION

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Display technologies based on a screen are mainly used for the design of an object in CAD. Usually tools for design are provided to the user via command bars, located on the side of the screen. The user can tune up the position and the lists of available commands at any given time and sometimes dock more functionalities if needed. The "ribbon" providers of commands are used in almost every design software (such as Word, PowerPoint, and Illustrator). The more tools displayed, the bigger the "ribbons" and the smaller the display size for the actual under design object. Tools are then accessible via icons displayed into the "ribbons". Once the icon corresponding to the right tool is clicked, the tool is activated and in use. This usually launches a display panel and sometimes modifies the appearance of the mouse cursor. If the user wants to change tool, the user must click again onto another icon which launches the new tool. The user needs to travel "cursor distance" every time they want to use a tool and it may be optimized (by himself) for a few tasks but not for all of them. The optimization is not time effective and requires a good knowledge of the software. Sometimes tools are accessible via their representation in an inventory, accessible via menus of the software, and which plays a similar role to the command bars. When tools are in use they can keep their appearance while being instantiated in the virtual world.

It is also worth mentioning that in most recent video games, the user can see the avatar they manipulate via sending commands holding a tool in use.

Thus, the existing solutions listed above lack efficiency, notably from a user utilization point of view. Within this context, there is still a need for an improved solution for designing an object.

SUMMARY OF THE INVENTION

According to one aspect, it is therefore provided a computer-implemented method of three-dimensional design in an immersive virtual environment. The method comprises the step of determining a position of an instantiation of a physical designer in the virtual environment. The method also comprises the step of instantiating an object via an interaction of the instantiation of the physical designer with a stocking zone attached to its position. The interaction is controlled by a body configuration of the physical designer. And the method also comprises performing a design operation with the object.

The method may comprise one or more of the following:
- the method further comprises determining an orientation of the instantiation of the physical designer in the virtual environment, the stocking zone being further attached to the orientation of the instantiation of the physical designer;
- the orientation of the instantiation of the physical designer is controlled by the orientation of the physical designer;
- the object is one of a plurality of objects associated to the stocking zone;
- the method further comprises moving the instantiation of the physical designer in the virtual environment toward another object instantiated in the virtual environment; and associating the other object with the stocking zone via an interaction of the instantiation of the physical designer, the interaction being body controlled by the physical designer;
- the body configuration is a static position or a dynamic gesture; and/or
- the body configuration is the dynamic gesture of drawing the object out of a virtual container.

It is further proposed a computer program comprising instructions for performing the above method.

It is further proposed a computer readable storage medium having recorded thereon the above computer program.

It is further proposed a CAD system comprising a processor coupled to a memory and a virtual immersion interface, the memory having recorded thereon the above computer program.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments of the invention will now be described, by way of non-limiting example, and in reference to the accompanying drawings, where:

FIGS. 3-24 show an example of performing the method with an example of the system.

DETAILED DESCRIPTION OF THE INVENTION

A description of example embodiments of the invention follows.

Figure 1:
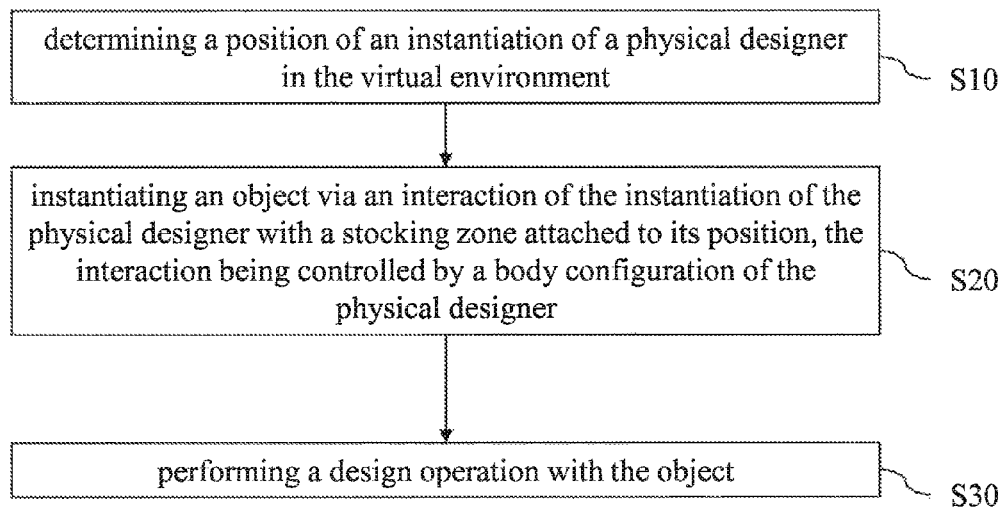
FIG. 1 shows a flowchart of an example of the method.

FIG. 1 shows a flowchart of an example of the computer-implemented method of three-dimensional (3D) design in an immersive virtual environment. The method comprises the step of determining (S10) a position of an instantiation of a physical designer in the virtual environment. The method also comprises instantiating (S20) an object via an interaction of the instantiation of the physical designer with a stocking zone. The stocking zone is attached to the position of the instantiation of the designer. The interaction is controlled by a body configuration of the physical designer. The method then comprises performing (S30) a design operation with the object.

Such a method improves the field of 3D design, by being more user-friendly and thus allowing a faster design, thanks to the immersion in a virtual environment and the presence of the stocking zone with its specificities.

Notably, the method may be for the purpose of designing of a 3D modeled object, e.g. that represents a part (e.g. a mechanical part). The step of performing (S30) a design operation with the object may indeed be performed on a 3D modeled object (e.g. another object). The design operation may be performed at least with another object (the one instantiated at step (S20)), which may be a tool or an object to be assembled. The object instantiated at (S20) may itself be a 3D modeled object.

A modeled object is any object defined by data stored in a memory of a computer system. By extension, the expression "modeled object" designates the data itself "Designing a 3D modeled object" designates any action or series of actions which is at least part of a process of elaborating a 3D modeled object. Thus, the method may comprise creating a 3D modeled object from scratch. Alternatively, the method may comprise providing a 3D modeled object previously created, and then modifying the 3D modeled object.

The 3D modeled object may be a CAD modeled object or a part of a CAD modeled object. In any case, the 3D modeled object designed by the method may represent the CAD modeled object or at least part of it, e.g. a 3D space occupied by the CAD modeled object, e.g. in the virtual environment. A CAD modeled object is any object defined by data stored in a memory of a CAD system. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space, e.g. for positioning and representing the modeled object in the virtual environment according to the instantiation of the physical designer, e.g. its position).

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process. The method can be implemented using a CAM system. A CAM system is any system suitable at least for defining, simulating and controlling manufacturing processes and operations.

The method is computer-implemented. This means that the method is executed on at least one computer or any system alike (i.e. with a processing unit and a memory). For example, the method may be implemented on a CAD system. Thus, steps of the method are performed by the computer, possibly fully automatically, or, semi-automatically (e.g. steps which are triggered by the user and/or steps which involve user-interaction, as explained later).

A typical example of computer-implementation of the method is to perform the method with a system suitable for this purpose. The system may comprise a memory having recorded thereon instructions for performing the method. In other words, software is already ready on the memory for immediate use. The system is thus suitable/adapted for performing the method without installing any other software. Such a system may also comprise at least one processor coupled with the memory for executing the instructions. In other words, the system comprises instructions coded on a memory coupled to the processor, the instructions providing means for performing the method.

Such a system may be a CAD system. The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The system comprises at least one a virtual immersion interface for launching execution of the instructions, for example by a user (i.e. the physical designer). Notably, the virtual immersion interface may allow the physical designer to make its instantiation interact with the virtual environment, notably the stocking zone, via its body configuration. The virtual immersion interface may for example comprise detectors for detecting the body configuration, e.g. optical detectors or movement detectors attached to the physical designer's body (e.g. the arms of the designer). Also, the virtual immersion interface may allow the physical designer to modify the position of its instantiation in the virtual environment. The virtual immersion interface may for example comprise detectors of the real position of the physical designer for translating it as a position in the virtual environment (the method may in this case comprise the physical designer evolving in a predefined space, e.g. a room), or a controller of the position operable by the physical designer. Also, the virtual immersion interface may allow the representation (preferably 3D) to the physical designer of the object instantiated at (S20), and possibly also the representation of the virtual environment and/or the representation of the design operation being performed at (S30). The virtual immersion interface may for example comprise a plurality screens surrounding the physical designer for said representation (e.g. screen on all walls of a room where the designer evolves), or virtual immersion glasses (i.e. glasses with a screen and with detectors of movements for adapting the image on the screen according to the head movement of the physical designer). Such a system is an efficient tool for 3D design in an immersive virtual environment.

The 3D modeled object designed in fine is 3D (i.e. three-dimensional). This means that the modeled object is defined by data allowing its 3D representation. A 3D representation allows the viewing of the representation from all angles. For example, the modeled object, when 3D represented, may be handled and turned around any of its axes, or around any axis in the screen on which the representation is displayed. This notably excludes 2D icons, which are not 3D modeled, even when they represent something in a 2D perspective. The display of a 3D representation facilitates design (i.e. increases the speed at which designers statistically accomplish their task). This speeds up the manufacturing process in the industry, as the design of the products is part of the manufacturing process.

Figure 2:
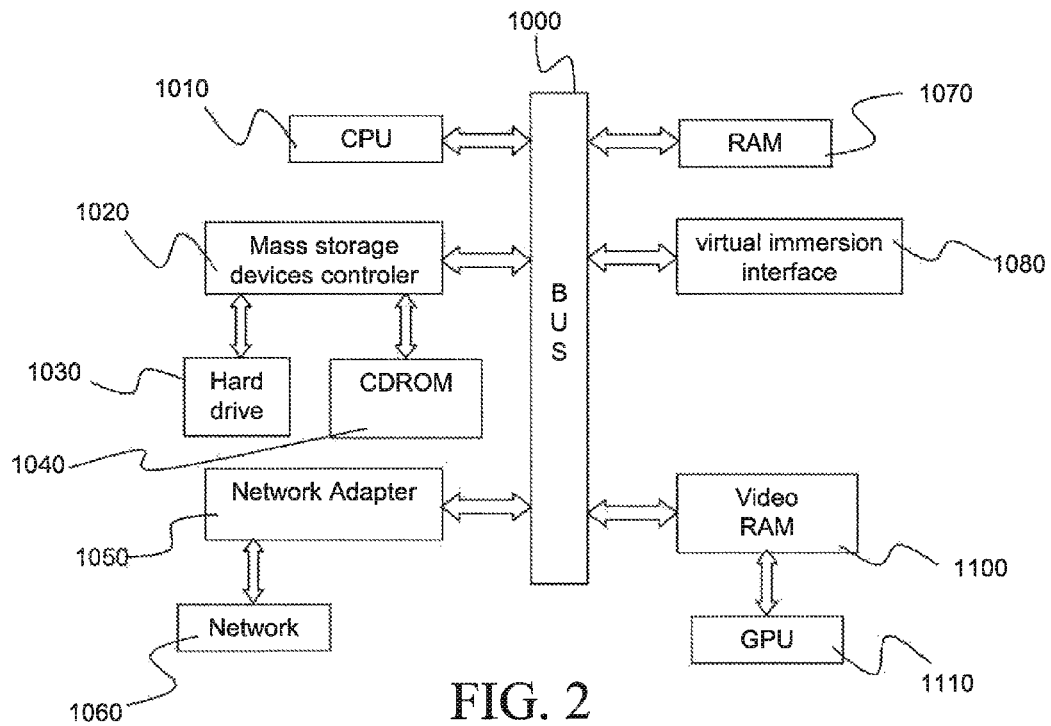
FIG. 2 shows an example of a client system.

FIG. 2 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphics processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer also comprises virtual immersion interface 1080 for the physical designer to trigger the method and interact with the system in order to perform the method.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

An immersive virtual environment designates a computer-simulated environment where objects (at least one) are simulated to a physical designer (i.e. a user, or, in other words, a person using the system, willing to perform design with the system) as if they were in the real world (i.e. the representation to the designer of the objects ensures such a simulation). For example, the system may be adapted to represent objects to the designer surrounding him at any angle between 0° and 360° with respect to a reference. This is known per se, but as an example, the system may comprise displaying objects on walls of a dedicated room, or using a pair of virtual immersion glasses, as discussed above. This excludes a representation on a single 2D screen, as traditionally used in CAD.

In the case of the method, the physical designer is further instantiated in the virtual environment, implying that he has at least a position in the virtual environment. Indeed, by "instantiating" the physical designer in the virtual environment, it is meant that the method defines data designating a geometry in the virtual environment that corresponds to the physical designer's body. Thus, the physical designer may, through such instantiation, move in the virtual environment and possibly interact with the virtual environment. The representation of the virtual environment to the designer may simulate the fact that the physical designer stands at the space occupied by its instantiation in the virtual environment. In effect, the method, which may be triggered at any time, starts by the determining (S10) of the position of the instantiation of the physical designer in the virtual environment (which may be later referred to as the "position of the designer in the virtual environment" for the sake of convenience). The determining (S10) may run as a background process, based on detectors of the designer moving in a room, or, using a movement controller, as discussed above.

The method then comprises instantiating (S20) an object and then performing (S30) a design operation with the object. The object may be any mechanical product, such as a tool to be used for 3D design on a product under construction (for example a cutting tool), or a part that the physical designer wants to assemble to a product under construction. Instantiating an object means, as known from the field of computer science, loading a version of the object in the virtual environment and having said version available for use.

The instantiating (S20) is performed via an interaction of the instantiation of the physical designer with a stocking zone attached to its position, the interaction being controlled by a body configuration of the physical designer. The performing (S30) may be performed likewise (but possibly using another body configuration). After the instantiating (S20), the instantiated object may be represented to the designer. This facilitates the performing (S30).

The stocking zone corresponds to any zone, i.e. a geometry (e.g. a point or a space, i.e. a volume, e.g. small, e.g. smaller than the volume occupied by the instantiation of the designer), of the virtual environment of which function is to stock objects. In other words, a stocking zone is defined by data associating a zone of the virtual environment to a data container in which objects (their data) may be contained. The stocking may be associated to a plurality of objects. Indeed, the object instantiated at (S20) may be one of such plurality.

The stocking zone is attached to the position of the instantiation of the physical designer in the virtual world.

The position of the designer in the virtual world is a point associated to the designer that may be defined in any way (for example the center of the projection of the head on the floor, or, the center of gravity of the designer). In other words, the stocking zone moves along with the physical designer as the latter moves in the virtual environment. The stocking zone may be strictly fixed relative to the position of the physical designer in the virtual environment, or, it may be at a fixed distance (the orientation being free), and/or, the stocking zone may follow the position of the designer smoothly (i.e. with a small variability around a fixed position).

The virtual environment is typically continuously displayed to the physical designer as the physical designer navigates/moves in the virtual environment. However, the stocking zone may be visible or invisible. In other words, it may or may not have an actual representation in the virtual environment. Nevertheless, the objects contained in the stocking zone may or may not be visible, independently of the visibility of the stocking zone itself. The stocking zone allows the transportation of objects along with the designer in an area attached to its position.

Now, the designer may interact with the stocking zone via the designer's instantiation in the virtual environment. For example, the designer may place objects or draw objects from the stocking zone via such interaction. The interaction is precisely controlled by a body configuration of the physical designer. For example, the physical designer may take at least one specific posture (i.e. a static position) and/or perform at least one specific dynamic gesture (a dynamic movement of the designer) for controlling the interaction, e.g. without necessarily changing the designer's position. Preferably, in order to make the immersion more realistic, the body configuration (for the instantiation (S20)) may be the dynamic gesture of drawing the object out of a virtual container and/or the body configuration for putting an object into the stocking zone may be the dynamic gesture of putting the object inside a virtual container. In other words, the physical designer may make its instantiation draw an object from the stocking zone by actually making a draw gesture in the real world, and/or put an object in the stocking zone by actually making a put gesture in the real world.

Because the stocking zone is attached to the position of the instantiation of the designer and because the physical designer controls the interaction with a simple body configuration, the method efficiently simulates the designer having a tool bag of the virtual world where one can put objects and transport them with oneself, in order to travel less distance during the design. Thus, the method efficiently facilitates design in a virtual environment as it helps travel little distance (since virtual objects may be carried around by the designer). Also, the fact that the stocking zone is attached to the position of the designer in the virtual environment makes it very realistic when the interaction of the instantiation with the stocking zone is controlled via a body configuration. Thus, the method and system offer a realistic and efficient tool for a fast design.

The method may further comprise determining an orientation of the instantiation of the physical designer in the virtual environment, in the same way that the determining (S20) is performed. Determining the orientation may actually be performed simultaneously as determining the position of physical designer in the virtual world. The orientation may be an angle, with reference to a given horizontal line of the virtual environment. It may be the orientation of the upper body of the designer, or the orientation of his head. In any case, the stocking zone may be further attached to the orientation of the instantiation of the physical designer. For example, the stocking zone is fixed relative to a reference horizontal line attached to a part of the designer, such that the stocking zone follows the designer as the designer not only moves its position but also changes its orientation. Indeed, the virtual immersion interface may be adapted to ensure that the orientation of the instantiation of the physical designer is controlled by the orientation of the physical designer. This simulates having e.g. a bag attached e.g. to a shoulder, the orientation being the one of the upper part of the designer. Also, this allows, if the stocking zone is for example positioned behind the head of the designer, that the designer's vision is not disturbed by the stocking zone and/or the objects contained in the stocking zone (provided that these are visible) when the designer changes his orientation.

The method described is about instantiating (S20) an object and then performing (S30) a design operation with it. However, the system may also be adapted to moving in the virtual environment and adding objects found there to the stocking zone. For example, the method may further comprise moving the instantiation of the physical designer in the virtual environment toward another object instantiated in the virtual environment. Then, the designer may associate the other object with the stocking zone via an interaction of the instantiation of the physical designer, the interaction being, as for the instantiation (S20), body controlled by the physical designer. This newly added object may then be used for a later design operation.

The method and system propose a personalized space to an immersed designer where he/she can store his/her tools (i.e. object). The stocking zone (and the objects into it) is attached to the position and possibly the configuration of the designer's instantiation's body. As the designer moves into the 3D virtual environment, the stocking zone moves accordingly. The stocking zone may be personalized in any aspect (e.g. shape, appearance, and/or position relative to the designer). The method may thus comprise a step of performing such personalization. The stocking zone thus does not restrain the ability for the designer to interact with his design (no occlusion). The stocking zone participates to the immersion by providing 3D virtual objects such as tools and design elements without going out of the 3D virtual World. The stocking zone provides very fast access to every object dropped into it.

With examples of the method and system, the designer may see which are the last tools/objects he used or stored, the system thus offering instant feedback. The designer may travel into a virtual design environment without concern of losing his tools. The system thus ensures that there is no time loss for access to a particular set of tools. The designer is more efficient in designing multi-objects tasks or for composing. The objects can be stored in the stocking zone and be accessed at will and without time cost. The stocking zone can be used for storing different configurations of tools simultaneously. The stocking zone can also be used for storing/making available information such as warning, or, errors about the design. With the stocking zone always at the best possible place for the user in the example where it is tuned by him, the user avoids ergonomic problems.

An example of performing the method with an example of the system is now discussed with reference to FIGS. 3-24.

Figure 3:
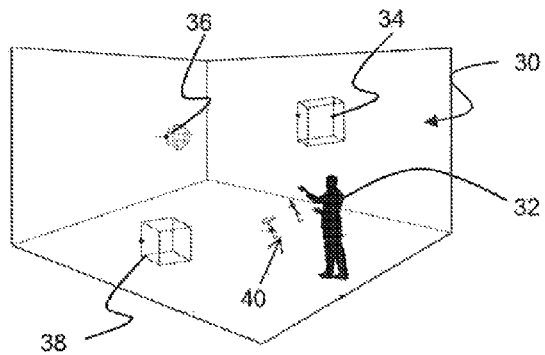

The system provides an immersive virtual environment for immersive design (also called scene). FIG. 3 shows such a virtual environment 30 that is a partial 3D virtual environment. The designer is immersed in the virtual environment 30 and thus has an instantiation 32 in the virtual environment 30. The designer has a deep feeling of belonging to this 3D virtual environment. The designer is physically into the virtual environment (e.g. if the virtual environment is a room and the virtual immersion interface comprises a corresponding space) or directly controls an avatar (its instantiation 32) with its body.

The software may capture the exact body configuration and position of the designer. With sensors the software may know the exact configuration of the designer's body. The software may also be able to provide a precise position of the designer into the 3D virtual environment 30. When the designer moves, the 3D environment comprising the generated stocking zone (and his avatar if needed) is updated according to his movements. In this sense, the stocking zone is attached to the designer's position in the virtual environment.

FIG. 3 also shows objects (34, 36, 38, 40) comprising elements (34, 36, 38) and two tools 40. The objects (34, 36, 38, 40) are instantiated in the virtual environment. The objects (34, 36, 38, 40) can be grabbed by the designer and moved inside the scene, thanks to an interaction of the instantiation 32 of the designer with the objects (34, 36, 38, 40), said interaction being controlled by a body configuration of the designer in the real world which is detected by the system.

Figure 4:
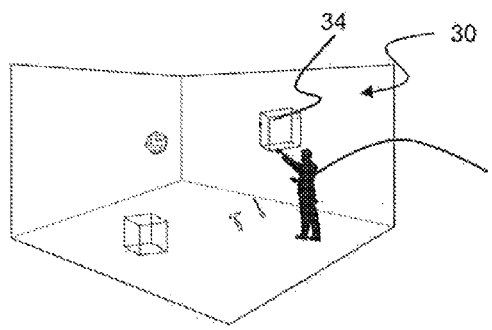
Figure 5:
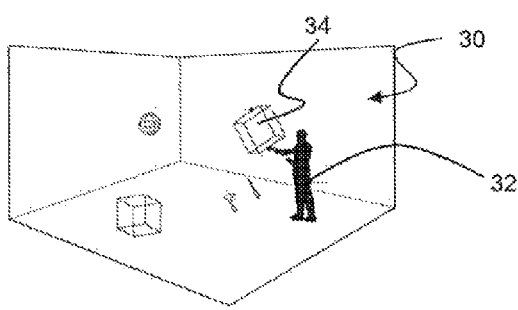
Figure 6:
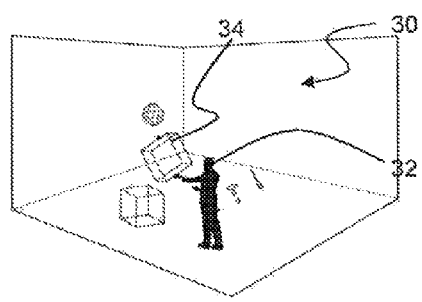
Figure 7:
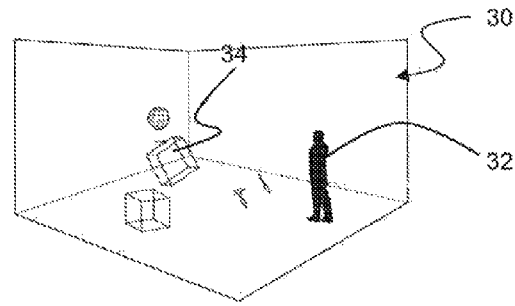

For example, once grabbed, object 34 follows the hand of the designer's instantiation 32 which grabbed it in every way it can move. Once released, dropped object 34 stays where it is until grabbed again. FIG. 4 represents the designer going for object 34. FIG. 5 represents the designer having grabbed object 34. FIG. 6 represents the designer having moved in the virtual environment with object 34 and FIG. 7 represents the designer having left its position after having released object 34.

Thus, the system of the example provides such interaction with the virtual environment, i.e. moving objects of the virtual environment.

Because some objects such as tools may be needed at any time, the software provides a customizable 3D virtual space inside the scene for storage and fast access to elements of the virtual environment (such as objects or tools) which position and/or orientation is attached to (e.g. follows) the designer's body position and/or orientation. When the designer moves, the stocking zone and the objects into the stocking zone move along with him. The stocking zone can be parameterized to be totally invisible but still functional.

Referring to FIGS. 8-14 which represent the instantiation 32 of the designer together with the stocking zone 80 as a 2D front projection, the stocking zone 80 (represented as a shaded area on the figures) can be tuned up. Its representation can be modified by using personalization tools of the system. The size, location and/or shape of the stocking zone 80 can be diverse, e.g. a parallelepiped, a sphere or a smaller sphere as respectively represented by FIGS. 8, 9 and 10. It can also mimic an offset of the shape of the designer's body as represented by FIG. 11, or just a part of his body as represented by FIG. 12. In this case there may be at least one hand of the designer which cannot be assigned as generating the stocking zone, so that the designer can grab objects without having them necessarily put into the stocking zone.

Any object dropped in the stocking zone, such as tool 40 as represented on FIG. 13, may become embedded into the stocking zone (the shape of the stocking zone thereby being modified, as represented on FIG. 14. In other words, if an object cannot geometrically entirely fit in the stocking zone, the stocking zone may automatically fit to the dropped object with a little offset.

Different scenarios are now presented referring to FIGS. 14-24.

Figure 15:
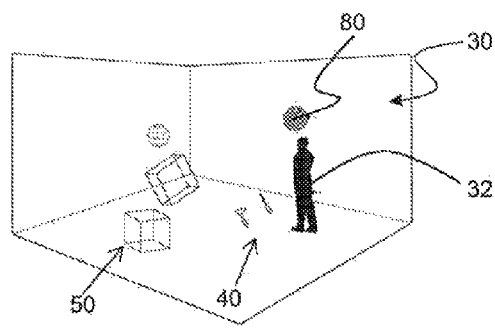
Figure 16:
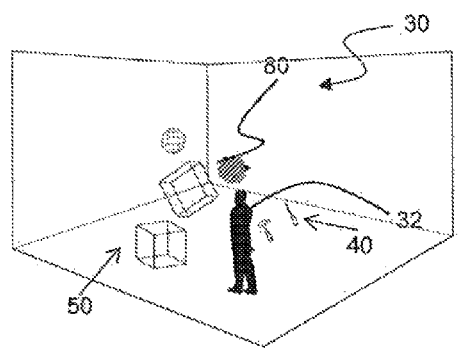
Figure 17:
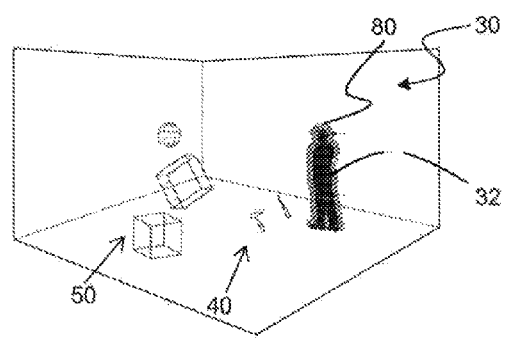
Figure 18:
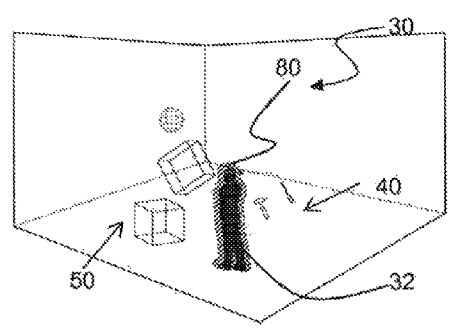

FIGS. 15-16 represent the instantiation 32 of the designer moving in the virtual environment 30 from one position (FIG. 15), to another position (FIG. 16) while not interacting with (e.g. grabbing) any object (tools 40 or parts 50) instantiated in the virtual environment. Also, the stocking zone 80 is represented. As shown on the figures, the stocking zone 80 follows the designer 32, as the stocking zone is attached to the designer's position. FIGS. 17-18 present a similar scenario, but the stocking zone 80 is a small sphere above the case of FIGS. 15-16 while the stocking zone 80 is a volume offsetting the designer's body in the case of FIGS. 17-18.

Referring to FIGS. 19-24, a scenario where the stocking zone 80 is a sphere is now discussed.

Figure 19:
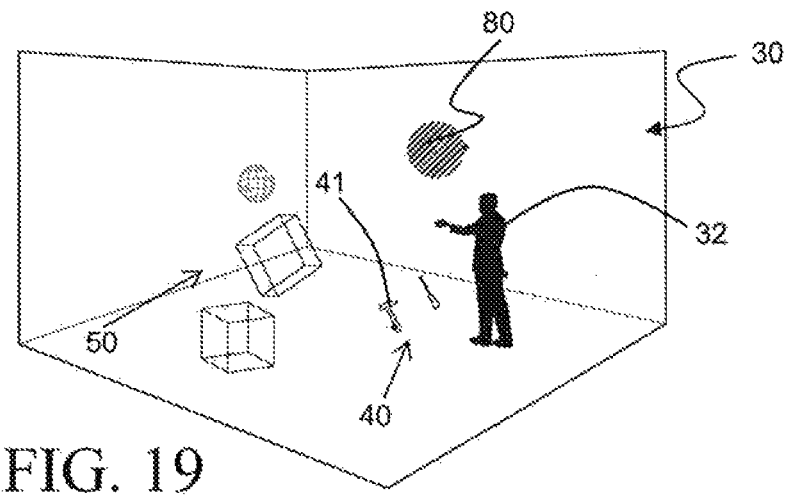
Figure 20:
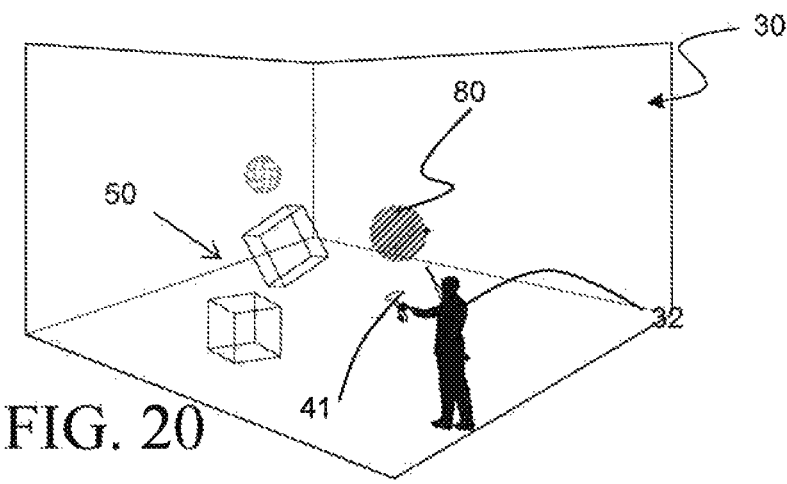
Figure 21:
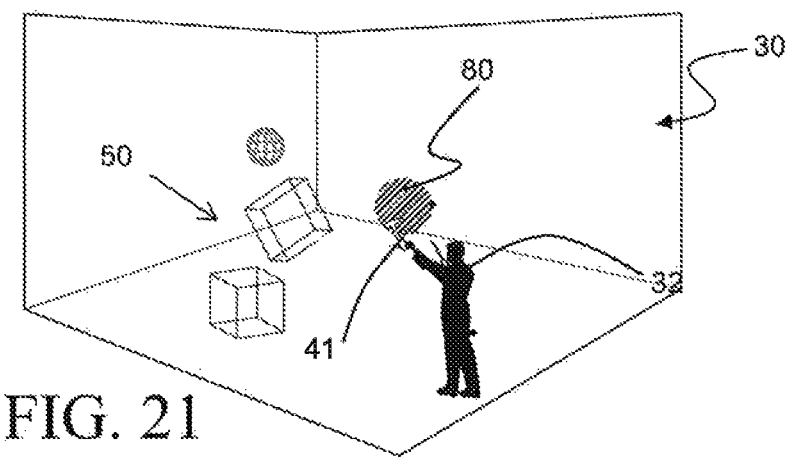
Figure 22:
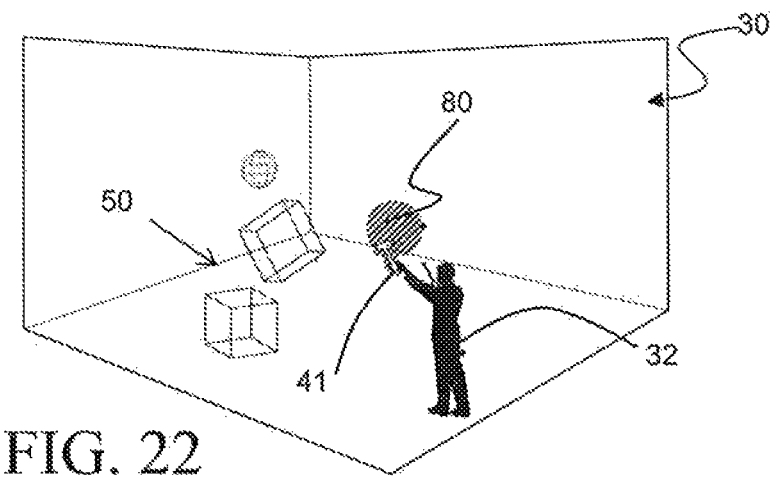
Figure 23:
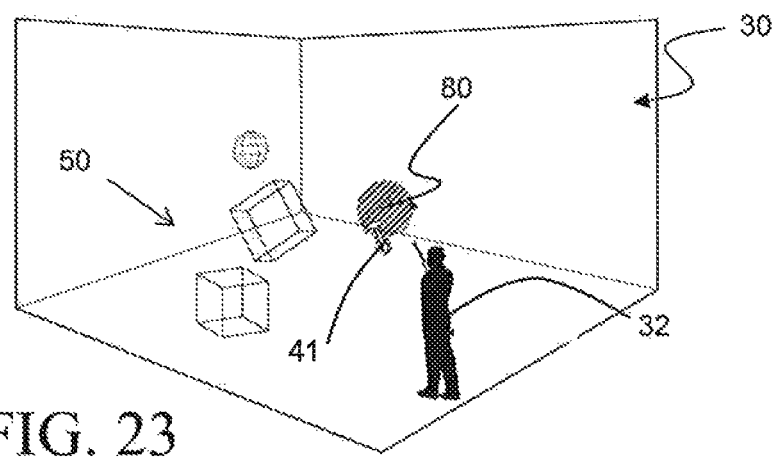
Figure 24:
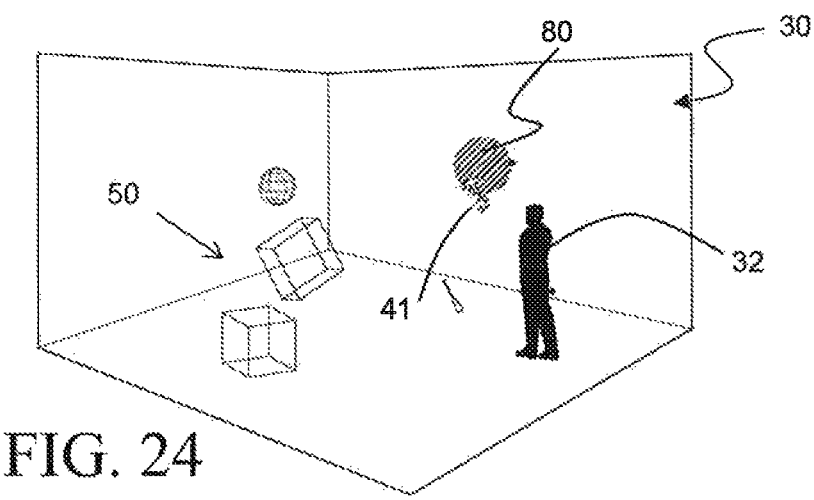

In this scenario, the instantiated designer 32 moves into the virtual environment 30 and grabs one of the objects (tools 40 or parts 50), here a tool which is hammer 41. This is represented by FIGS. 19 and 20. The designer 32 then adds tool 41 to the stocking zone 80, as shown on FIG. 21, which adapts itself to said tool 41, as shown on FIG. 22. Once dropped into the stocking zone 80, as shown on FIG. 23, an object stays inside it, keeping the same relative position to the designer 32 at all time. As shown on FIG. 24, the designer 32 may then move in the virtual environment 30, the stocking zone 80 follows the designer.

To instantiate in the virtual environment 30 an object which has been previously put in the stocking zone 80 e.g. according to the above scenario, the designer 32 can simply grab it from the stocking zone 80 and then drop it elsewhere in the virtual environment, or, deactivate the stocking zone 80.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. Computer-implemented method of three-dimensional design in an immersive virtual environment, wherein the method comprises the steps of:
    determining a position of an instantiation of a physical designer in the virtual environment;
    instantiating an object via an interaction of the instantiation of the physical designer with a stocking zone attached to the position of the instantiation of the physical designer, the object being one of a plurality of objects, the stocking zone being a virtual space within the virtual environment that contains the plurality of objects, the stocking zone being transported with the instantiation of the physical designer as the instantiation of the physical designer moves through the virtual environment, and the interaction being controlled by a body configuration of the physical designer; and
    performing a design operation with the object instantiated from the stocking zone.

2. The method of claim 1, wherein the method further comprises determining an orientation of the instantiation of the physical designer in the virtual environment, the stocking zone being further attached to the orientation of the instantiation of the physical designer.

3. The method of claim 2, wherein the orientation of the instantiation of the physical designer is controlled by the orientation of the physical designer.

4. The method of claim 1, wherein the method further comprises:
moving the instantiation of the physical designer in the virtual environment toward another object instantiated in the virtual environment; and
associating the other object with the stocking zone via an interaction of the instantiation of the physical designer, the interaction being body controlled by the physical designer.

5. The method of claim 1, wherein the body configuration is a static position or a dynamic gesture.

6. The method of claim 5, wherein the body configuration is the dynamic gesture of drawing the object out of a virtual container.

7. A computer program product comprising: a non-transitory data storage medium and instructions carried on the storage medium for implementing three-dimensional design in an immersive virtual environment, wherein the instructions cause one or more computer processors to:
determine a position of an instantiation of a physical designer in the virtual environment;
instantiate an object via an interaction of the instantiation of the physical designer with a stocking zone attached to the position of the instantiation of the physical designer, the object being one of a plurality of objects, the stocking zone being a virtual space within the virtual environment that contains the plurality of objects, the stocking zone being transported with the instantiation of the physical designer as the instantiation of the physical designer moves through the virtual environment, and the interaction being controlled by a body configuration of the physical designer; and
perform a design operation with the object instantiated from the stocking zone.

8. A CAD system comprising:
a virtual immersion interface; and
a processor coupled to memory, the memory having recorded thereon a computer program comprising instructions for performing three-dimensional design in an immersive virtual environment-by:
determining a position of an instantiation of a physical designer in the virtual environment;
instantiating an object via an interaction of the instantiation of the physical designer with a stocking zone attached to the position of the instantiation of the physical designer, the object being one of a plurality of objects, the stocking zone being a virtual space within the virtual environment that contains the plurality of objects, the stocking zone being transported with the instantiation of the physical designer as the instantiation of the physical designer moves through the virtual environment, and the interaction being controlled by a body configuration of the physical designer; and
performing a design operation with the object instantiated from the stocking zone.

9. A computer-implemented method for designing a three-dimensional object representing a product by instantiation of a physical designer in an immersive virtual environment and through interaction of the instantiation of the physical designer with the virtual environment, the method comprising:
determining a position of the instantiation of a physical designer in the virtual environment, wherein a stocking zone is attached to the position of the instantiation of the physical designer and is moved along with the instantiation of the physical designer as the instantiation of the physical designer moves in the virtual environment;
as the instantiation of the physical designer encounters a plurality of objects in the virtual environment, the plurality of objects including a part to be assembled in the design of the product or a tool to be used in designing the product, associating the respective object with the stocking zone via an interaction of the instantiation of the physical designer, the interaction being controlled by a body configuration of the physical designer;
instantiating any one of the plurality of objects via an interaction of the instantiation of the physical designer with the stocking zone, the interaction being controlled by a body configuration of the physical designer; and
performing a design operation on at least a portion of the product with the object instantiated from the stocking zone.

* * * * *

UNITED STATES PATENT AND TRADEMARK OFFICE
CERTIFICATE OF CORRECTION

PATENT NO. : 9,721,045 B2
APPLICATION NO. : 13/944716
DATED : August 1, 2017
INVENTOR(S) : Pierre-Antoine Arrighi It is certified that error appears in the above-identified patent and that said Letters Patent is hereby corrected as shown below:

On the Title Page

In item (54) in the Title, before "Operation" insert --Design--;

In item (30) Foreign Application Priority Section, delete "12305902" and insert --12305902.4--.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*